(12) United States Patent
Tsai et al.

(10) Patent No.: US 7,265,697 B2
(45) Date of Patent: Sep. 4, 2007

(54) DECODER OF DIGITAL-TO-ANALOG CONVERTER

(75) Inventors: Chin-Chung Tsai, Hsinhua (TW); Kun-Cheng Hung, Hsinhua (TW)

(73) Assignee: Himax Technologies Limitd, Tainan County (TW)

( * ) Notice: Subject to any disclaimer, the term of this patent is extended or adjusted under 35 U.S.C. 154(b) by 0 days.

(21) Appl. No.: 11/364,725

(22) Filed: Feb. 27, 2006

(65) Prior Publication Data

US 2006/0202870 A1  Sep. 14, 2006

Related U.S. Application Data

(60) Provisional application No. 60/660,129, filed on Mar. 8, 2005.

(51) Int. Cl.
*H03M 1/66* (2006.01)

(52) U.S. Cl. ...................... 341/144; 257/258

(58) Field of Classification Search ............. 341/144; 257/258; 327/554

See application file for complete search history.

(56) References Cited

U.S. PATENT DOCUMENTS

| | | | | |
|---|---|---|---|---|
| 6,459,331 | B1 * | 10/2002 | Takeuchi et al. | 327/554 |
| 2001/0052867 | A1 * | 12/2001 | Ureshino | 341/144 |
| 2002/0100925 | A1 * | 8/2002 | Hsiao et al. | 257/258 |

* cited by examiner

*Primary Examiner*—Jean Bruner Jeanglaude
(74) *Attorney, Agent, or Firm*—J.C. Patents

(57) ABSTRACT

In a decoder of a digital-to-analog converter, the gamma voltage selection is controlled by a reduced number of NMOS and PMOS transistors according to the characteristic of the NMOS and PMOS transistor, such that the layout area of the switch array is reduced. Moreover, a N-type buried diffusion (BDN) layer and a P-type buried diffusion (BDP) layer are adopted to replace the contacts in the layout of conventional decoder, such that the layout can be simplified and the bump pad pitch thereof can be decreased.

21 Claims, 7 Drawing Sheets

DECODER OF DIGITAL-TO-ANALOG CONVERTER

CROSS-REFERENCE TO RELATED APPLICATION

This application claims the priority benefits of U.S. provisional application titled "A DAC DESIGN CAPABLE OF FINE PITCH LAYOUT" filed on Mar. 8, 2005, Ser. No. 60/660,129. All disclosure of this application is incorporated herein by reference.

BACKGROUND OF THE INVENTION

1. Field of the Invention

The present invention generally relates to a decoder, in particular, to a decoder of a digital-to-analog converter.

2. Description of Related Art

Binary digital impulses appear as long strings of ones and zeros, and have no apparent meaning to a human observer, but when a digital-to-analog converter (DAC) is used to decode the binary digital signals, meaningful output appears. The output might be a voice, a picture, a musical tune, or mechanical motion. The digital-to-analog converters transform a digital word representing an analog value such as a voltage into an output corresponding to that analog value.

FIG. 1 shows a function block of a digital-to-analog converter. Output Outs is selected from gamma voltage $Vr_0 \sim Vr_{2^n-1}$ by corresponding decoder input which is controlled by digital codes $A_0 \sim A_{n-1}$ and $\overline{A_0} \sim \overline{A_{n-1}}$. Here, we choose $A_{n-1}$ as Most Significant Bit (MSB) and $A_0$ as Least Significant Bit (LSB). The output voltage $Out_i$ passes through OP buffer to bump pad $Pout_i$.

Conventionally, the switch array (i.e. decoder) of the digital-to-analog converter (DAC) in the line-inversion LCD source driver is consisted of P-type Metal-Oxide-Semiconductor (PMOS) and N-type Metal-Oxide-Semiconductor (NMOS) transistors, which is controlled by digital codes $A_0 \sim A_{n-1}$, and $\overline{A_0} \sim \overline{A_{n-1}}$, as shown in FIG. 2. Each gamma voltage $Vr_0 \sim Vr_{2^n-1}$ is transmitted through transmission gate logic consisting of PMOS and NMOS transistors. When the switch arrays are disposed on same horizontal for each output voltage, the pitch of each channel for the output voltage should be wide enough. Unfortunately, source driver has limited width, and foundry also has mask reticle restriction. When the switch arrays are not disposed on same horizontal, twice routing-traces for the gamma voltage in the source driver would be required and the area of the source driver is increased.

FIG. 3 is a partial layout of the NMOS and PMOS switch arrays on the same horizontal, which uses conventional contact device. Referring to FIG. 3, when the contacts are disposed in the same row of the switch array, only a few contacts are needed to dispose between the gamma voltages, such that the bump pad pitch would not be increased. However, when the contacts are disposed in the same column of the switch array, the contacts are close to each other and more space between the rows of the switch array would be required for mask reticle, such that the bump pad pitch of the switch array is increased.

SUMMARY OF THE INVENTION

Accordingly, an object of the present invention is directed to a decoder of a digital-to-analog converter. In the decoder, the channels of the gamma voltage are divided into three parts according to the characteristic of the PMOS and NMOS transistors. One part of the channels is controlled by a NMOS switch array, another part of the channels is controlled by a PMOS switch array, and the other part of the channels is controlled by both of the NMOS and PMOS switch array. Therefore, the quantity of the PMOS and NMOS transistors can be reduced.

Another object of the present invention is directed to a decoder of a digital-to-analog converter. In the decoder, a plurality of N-type buried diffusion (BDN) layers are disposed under some of the NMOS transistors according to the digital signal and a plurality of P-type buried diffusion (BDP) layers are disposed under some of the PMOS transistors according to the digital signal, such that the layout area for metal-contact-poly structure is reduced and the bump pad pitch is also decreased.

The present invention is directed to a decoder of a digital-to-analog converter suitable for transforming a digital signal into a voltage signal. The decoder includes a first input stage, a second input stage, an output stage, a NMOS switch array, and a PMOS switch array. The first input stage provides multiple input voltages $Vr_0 \sim Vr_{2^n-1}$, wherein n is an integer larger than or equal to zero. The second input stage provides multiple digital code inputs of the digital signal. The output stage is used to receive and output the voltage signal. The NMOS switch array includes multiple NMOS transistors of k+1 columns which receive the input voltages $Vr_0 \sim Vr_k$ of the first input stage and the digital signal of the second input stage, so as to output one of the input voltages $Vr_0 \sim Vr_k$ to the output stage corresponding to the digital signal, wherein k is an integer larger than or equal to zero. The PMOS switch array includes multiple PMOS-transistors of $2^n-(k-m+1)$ columns which receive the input voltages $Vr_{k-m+1} \sim Vr_{2^n-1}$ the first input stage and the digital signal of the second input stage, so as to output one of the input voltages $Vr_{k-m+1} \sim Vr_{2^n-1}$ to the output stage corresponding to the digital signal, wherein m is an integer larger than or equal to zero.

The decoder of a digital-to-analog converter according to an embodiment of the present invention, wherein in the NMOS switch array, the NMOS transistors in the same column are connected in series, while the gates of the NMOS transistors in the same row are all coupled to one of the digital code inputs of the digital signal in the second input stage. In addition, the drains of the NMOS transistors in a first row are coupled to one of the input voltages $Vr_0 \sim Vr_k$ in the first input stage respectively and the sources of the NMOS transistors in a last row are all coupled to the output stage. Moreover, a plurality of N-type buried diffusion (BDN) layers are disposed under some of the NMOS transistors according to the digital signal, such that when the digital signal is inputted, the corresponding voltage signal is outputted.

The decoder of a digital-to-analog converter according to an embodiment of the present invention, wherein the BDN layers connect the source and drain of the NMOS transistors.

The decoder of a digital-to-analog converter according to an embodiment of the present invention, wherein in the PMOS switch array, the PMOS transistors in the same column are connected in series, while the gates of the PMOS transistors in the same row are all coupled to one of the digital code inputs of the digital signal in the second input stage. In addition, the sources of the PMOS transistors in the a row are coupled to one of the input voltages $Vr_{k-m+1} \sim Vr_{2^n-1}$ in the first input stage respectively and the drains of the PMOS transistors in a last row are all coupled to the output stage. Moreover, a plurality of P-type buried diffusion (BDP) layers are disposed under some of the PMOS transistors according to the digital signal, such that when the digital signal is inputted, the corresponding voltage signal is outputted.

The decoder of a digital-to-analog converter according to an embodiment of the present invention, wherein the BDP layers connect the source and drain of the PMOS transistors.

The decoder of a digital-to-analog converter according to an embodiment of the present invention, wherein the magnitudes of the input voltages $Vr_0 \sim Vr_k$ range from $V_{ss}$ to $V_{dd}-V_{TNB}$, wherein the $V_{ss}$ represents the negative electrode of the power, the $V_{dd}$ represents the positive electrode of the power, and the $V_{TNB}$ represents the threshold voltage of NMOS.

The decoder of a digital-to-analog converter according to an embodiment of the present invention, wherein the magnitudes of the input voltages $Vr_{k-m+1} \sim Vr_{2^n-1}$ range from $|V_{TPB}|$ to $V_{dd}$, wherein the $V_{dd}$ represents the positive electrode of the power, and the $V_{TPB}$ represents the threshold voltage of PMOS.

The decoder of a digital-to-analog converter according to an embodiment of the present invention, wherein two guard rings, coupled to the positive and the negative electrode of the power respectively, are disposed between the NMOS and PMOS switch array to avoid latchup effect.

The decoder of a digital-to-analog converter according to an embodiment of the present invention, wherein a space with a unit length is reserved between the NMOS and PMOS switch array to avoid latchup effect.

The present invention is directed to a decoder of a digital-to-analog converter suitable for transforming a digital signal into a voltage signal. The decoder includes a first input stage, a second input stage, an output stage, a NMOS switch array, and a PMOS switch array. The first input stage provides multiple input voltages $Vr_0 \sim Vr_{2^n-1}$, wherein n is an integer larger than or equal to zero. The second input stage provides multiple digital code inputs $A_0, \overline{A_0}, \ldots, A_{n-1}, \overline{A_{n-1}}$ of the digital signal. The output stage is used to receive and output the voltage signal. The NMOS switch array includes nodes of k+1 columns and 2*n rows, wherein multiple NMOS transistors are disposed in some of the nodes according to the digital signal. The NMOS switch array is suitable for receiving the input voltages $Vr_0 \sim Vr_k$ of the first input stage and the digital signal of the second input stage, and outputting one of the input voltages $Vr_0 \sim Vr_k$ to the output stage corresponding to the digital signal, wherein k is an integer larger than or equal to zero. The PMOS switch array includes nodes of $2^n-(k-m+1)$ columns and 2*n rows, wherein multiple PMOS transistors are disposed in some of the nodes according to the digital signal. The PMOS array is suitable for receiving the input voltages $Vr_{k-m+1} \sim Vr_{2^n-1}$ of the first input stage and the digital signal of the second input stage, and outputting one of the input voltages $Vr_{k-m+1} \sim Vr_{2^n-1}$ to the output stage corresponding to the digital signal, wherein m is an integer larger than or equal to zero.

The decoder of a digital-to-analog converter according to an embodiment of the present invention. In the NMOS switch array, the NMOS transistors in the same column are connected in series, the gates of the NMOS transistors in the same row are all coupled to one of the digital code inputs of the digital signal of the second input stage, the drains of the first NMOS transistors in each column are coupled to one of the input voltages $Vr_0 \sim Vr_k$ of the first input stage respectively, and the sources of the last NMOS transistors in each column are all coupled to the output stage.

The decoder of a digital-to-analog converter according to an embodiment of the present invention. In the PMOS switch array, the PMOS transistors in the same column are connected in series, the gates of the PMOS transistors in the same row are all coupled to one of the digital code inputs of the digital signal of the second input stage, the sources of the first PMOS transistors in each column are coupled to one of the input voltages $Vr_{k-m+1} \sim Vr_{2^n-1}$ of the first input stage respectively, and the drains of the last PMOS transistors in each column are all coupled to the output stage.

In the present invention, the gamma voltage selection is controlled by a reduced number of NMOS and PMOS transistors according to the characteristic of the NMOS and PMOS transistor, such that the area of the switch array is reduced. Moreover, BDNs and BDPs are adopted and the number of contacts can be reduced, such that the bump pad pitch is decreased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
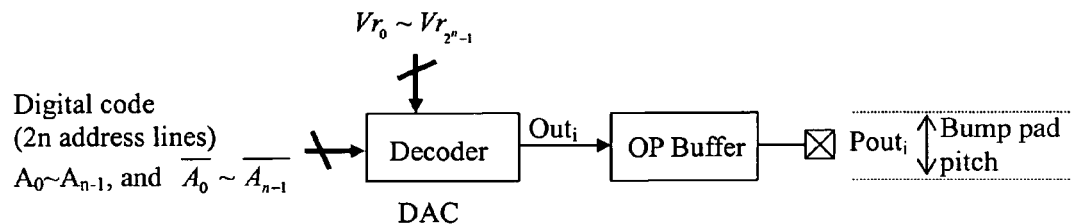
FIG. 1 is a function block of a digital-to-analog converter.
Figure 2:
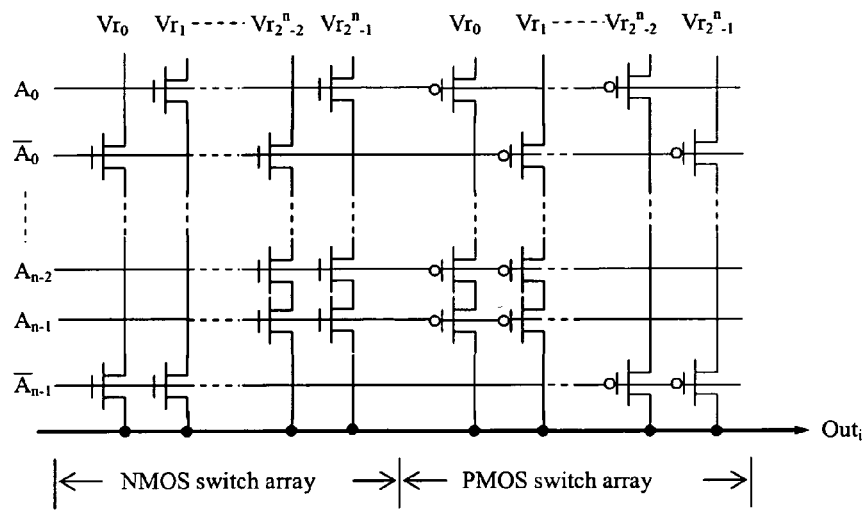
FIG. 2 is a circuit of a decoder of the digital-to-analog converter.

Reference will now be made in detail to the present preferred embodiments of the invention, examples of which are illustrated in the accompanying drawings. Wherever possible, the same reference numbers are used in the drawings and the description to refer to the same or like parts.

Figure 4:
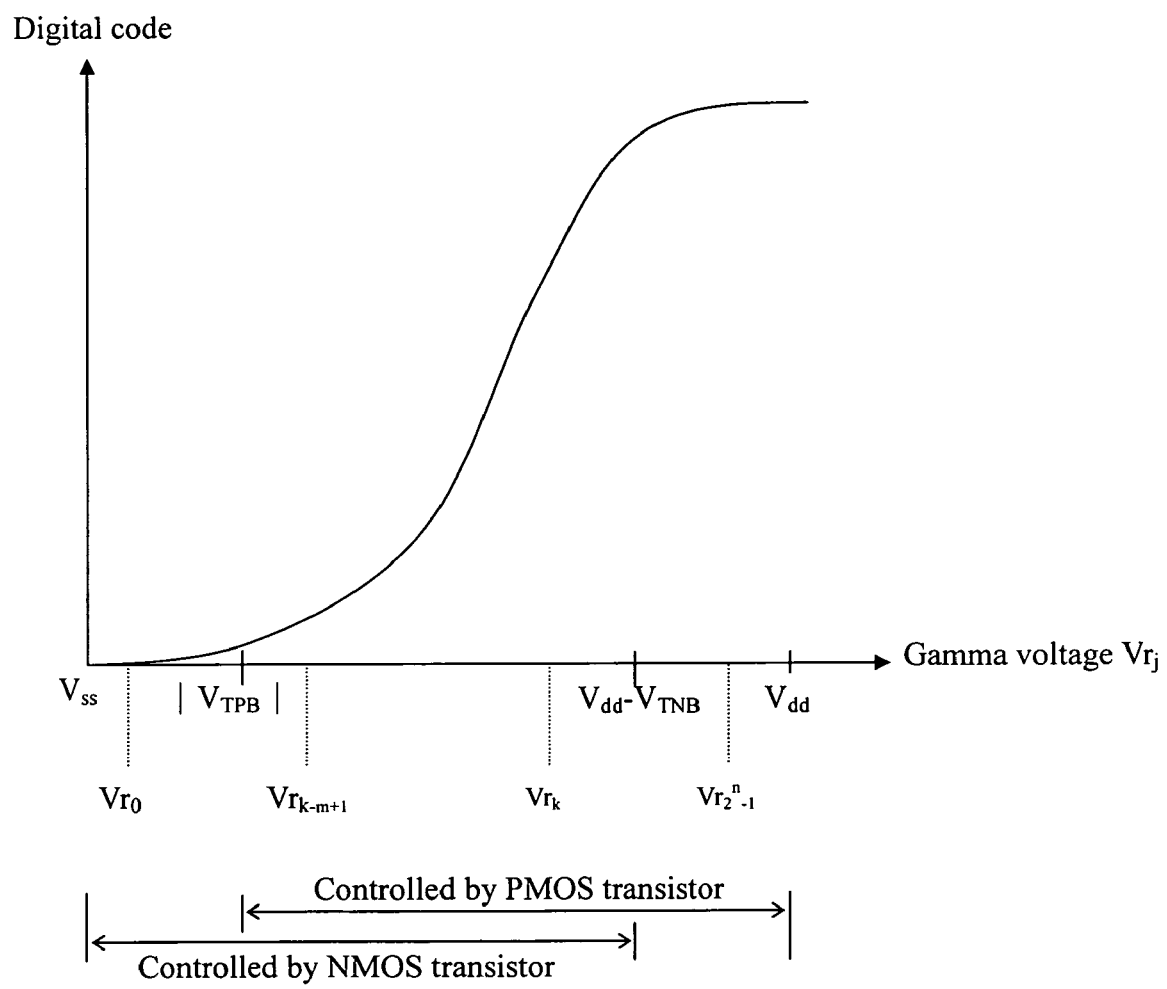
FIG. 4 is a diagram illustrating the relation between digital code and gamma voltage $Vr_j$ according to an embodiment of the present invention.

FIG. 4 is a diagram illustrating the relation between digital code and gamma voltage $Vr_j$ according to an embodiment of the present invention. Referring to FIG. 4, the value of digital codes $A_0 \sim A_{n-1}$, and $\overline{A_0} \sim \overline{A_{n-1}}$ are mapped to the gamma voltage $Vr_j$. Because of the characteristic of the PMOS and NMOS transistors, the gamma voltage $Vr_j$ between $|V_{TPB}|$ and $V_{dd}$ can be controlled by PMOS transistor, and the gamma voltage $Vr_j$ between $V_{ss}$ and $V_{dd}-V_{TNB}$ can be controlled by NMOS transistor. Here, $V_{TPB}$ is the threshold voltage of PMOS transistor (with body effect), and $V_{TNB}$ is the threshold voltage of NMOS transistor (with body effect).

Therefore, in order to reduce the quantity of the PMOS and NMOS transistors, a digital code value is chosen as a break point. When the gamma voltage is located between $Vr_0$ and $Vr_k$, which are marked by the foot note value 0 to k, NMOS transistors are used to control the gamma voltage selection. When the gamma voltage is located between $Vr_{k-m+1}$ and $Vr_{2^n-1}$, which are marked by the foot note value (k−m+1) to ($2^n$−1), PMOS transistors are used to control the gamma voltage selection. Moreover, when the gamma voltage is located between $Vr_{k-m+1}$ and $Vr_k$, which are marked by the foot note value (k−m+1) to k, both NMOS and PMOS transistors are used to control the gamma voltage selection.

In the present embodiment, a negative electrode of the power $V_{ss}$ is chosen as the minimum gamma voltage, and a positive electrode of the power $V_{dd}$ is chosen as the maximum gamma voltage. However, it should be noted that the minimum gamma voltage $Vr_0$ is not limited to $V_{ss}$, and the maximum gamma voltage is not limited to $V_{dd}$. For example, $Vr_0$ can be 0.1 $V_{dd}$ and $Vr_{2^n-1}$ can be 0.9 $V_{dd}$. The relation between gamma voltage $Vr_j$, $V_{ss}$, and $V_{dd}$ can be presented as $V_{ss} \leq Vr_i \leq V_{dd}$, i=0 to $2^n$−1.

Figure 5:
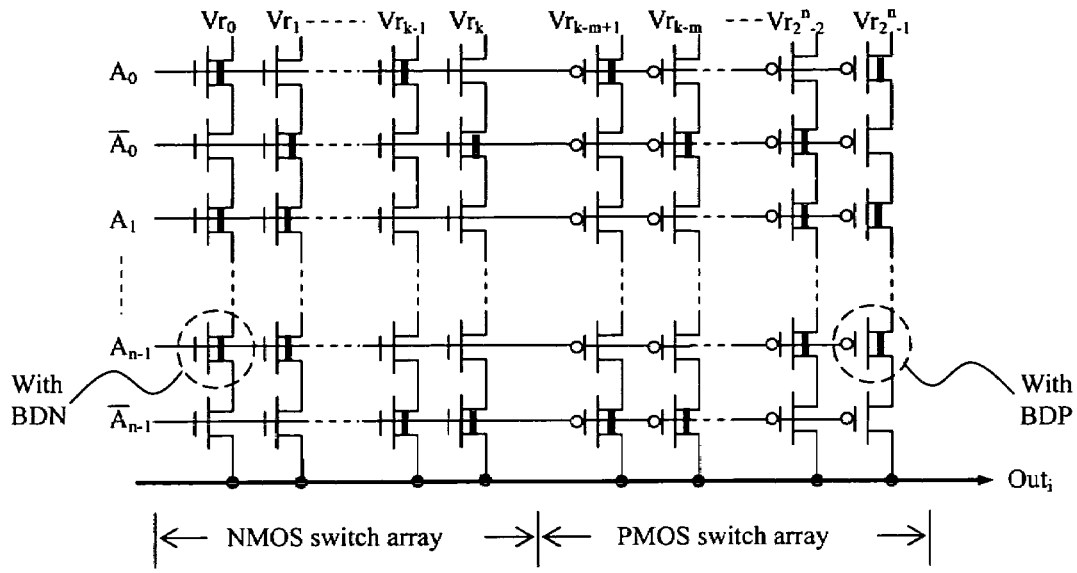
FIG. 5 is a circuit of a decoder of the digital-to-analog converter according to an embodiment of present invention.

FIG. 5 is a circuit of a decoder of the digital-to-analog converter according to an embodiment of present invention. Referring to FIG. 5, the decoder includes a first input stage, a second input stage, an output stage, a NMOS switch array, and a PMOS switch array. The first input stage provides multiple input voltages $Vr_0 \sim Vr_{2^n-1}$, wherein n is an integer larger than or equal to zero. The second input stage provides multiple digital code inputs $A_0, \overline{A_0}, \ldots, A_{n-1}, \overline{A_{n-1}}$ of the digital signals. The output stage is used to receive and output the voltage signals.

In addition, the NMOS switch array includes multiple NMOS transistors of k+1 columns and 2*n rows which receive the input voltages $Vr_0 \sim Vr_k$ of the first input stage and the digital signal of the second input stage, so as to output one of the input voltages $Vr_0 \sim Vr_k$ to the output stage corresponding to the digital signal, wherein k is an integer larger than or equal to zero. The PMOS switch array includes multiple PMOS transistors of $2^n$−(k−m+1) columns and 2*n rows which receive the input voltages $Vr_{k-m+1} \sim Vr_{2^n-1}$ of the first input stage and the digital signal of the second input stage, so as to output one of the input voltages $Vr_{k-m+1} \sim Vr_{2^n-1}$ to the output stage corresponding to the digital signal, wherein m is an integer larger than or equal to zero.

Moreover, in the NMOS switch array, the NMOS transistors in the same column are connected in series, while the gates of the NMOS transistors in the same row are all coupled to one of the digital code inputs of the digital signal in the second input stage. In addition, the drains of the NMOS transistors in the first row are coupled to one of the input voltages $Vr_0 \sim Vr_k$ in the first input stage respectively and the sources of the NMOS transistors in the 2*n-th row (i.e. last low) are all coupled to the output stage. Moreover, N-type buried diffusion (BDN) layers are disposed under some of the NMOS transistors according to the digital signal, such that when the digital signal is inputted, the corresponding voltage signal is outputted.

In the PMOS switch array, the PMOS transistors in the same column are connected in series, while the gates of the PMOS transistors in the same row are all coupled to one of the digital code inputs of the digital signal in the second input stage. In addition, the sources of the PMOS transistors in the first row are coupled to one of the input voltages $Vr_{k-m+1} \sim Vr_{2^n-1}$ in the first input stage respectively and the drains of the PMOS transistors in the 2*n-th row (i.e. last low) are all coupled to the output stage. Moreover, P-type buried diffusion (BDP) layers are disposed under some of the PMOS transistors according to the digital signal, such that when the digital signal is inputted, the corresponding voltage signal is outputted.

In the present embodiment, the gamma voltage of the DAC is divided into a high voltage part, which ranges from $Vr_{k-m+1}$ to $Vr_{2^n-1}$, and a low voltage part, which ranges from $Vr_0$ to $Vr_k$. The high voltage part is transmitted by a PMOS switch array, and the low voltage part is transmitted by a NMOS switch array, such that the quantity of the transistors can be reduced and fine pitch is achieved. Meanwhile, a N-type buried diffusion (BDN) and a P-type buried diffusion (BDP) layer are used to short the source and drain of the NMOS and PMOS transistors respectively, such that the area of the metal-contact-ploy structure can be reduced.

The foregoing BDP and BDN layers are formed prior to the poly-silicon layer and provide a better semiconductor process for the embodiments of the present invention. In the present invention, the gamma voltage $Vr_j$ is connected to a series of PMOS or NMOS transistors so that a simplified circuit and layout are realized. Here, PMOS transistors are used in high level gamma voltage $Vr_j$ ($Vr_j$ between $|V_{TPB}|$ and $V_{dd}$) uses, while NMOS transistors are implements in low level gamma voltage $Vr_j$ ($Vr_j$ between $V_{ss}$ and $V_{dd}$−$V_{TNB}$). Meanwhile, the threshold voltage of PMOS and NMOS ($V_{TPB}$, $V_{TNB}$) can be adjusted for lower-$V_{dd}$ operation. Besides, an extra connection line can be added to the gamma voltage $Vr_j$ and short different $Out_i$ together so as to enhance the strength of the gamma voltage power lines.

Figure 6:
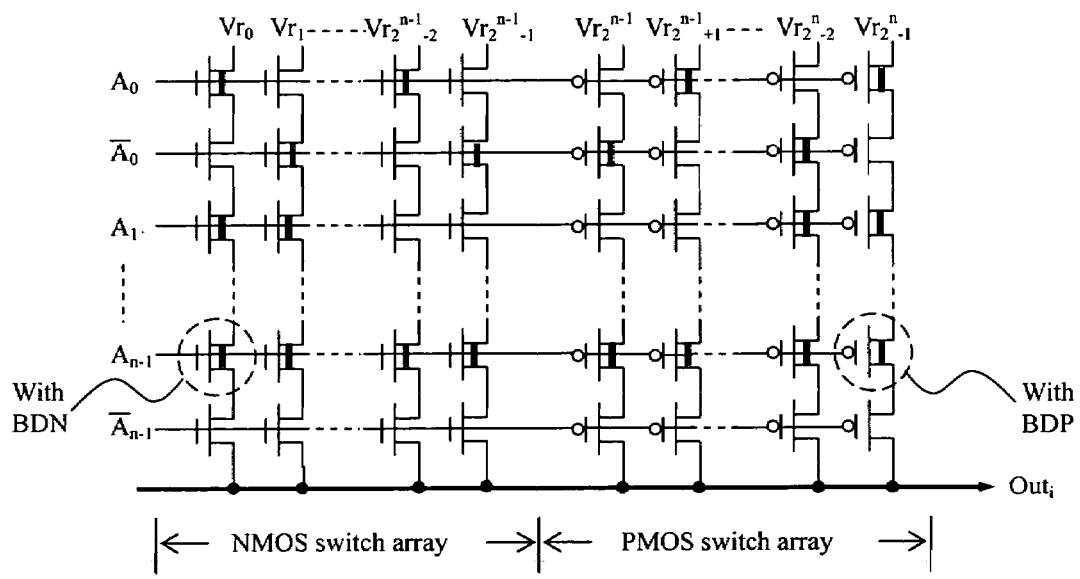
FIG. 6 is a special case of FIG. 5 according to an embodiment of present invention.

FIG. 6 is a special case of FIG. 5 according to an embodiment of present invention, wherein k is equal to $2^{n-1}$−1 and m is equal to 0. Referring to FIG. 6, k is chosen as a middle value of the digital codes, such that the quantity of the NMOS transistors is equal to the quantity of the PMOS transistors and the quantity of the total transistors can be reduced up to 50%. Each gamma voltage is controlled by single series of NMOS transistors or single series of PMOS transistors. Therefore, the circuit in FIG. 6 can be implemented by a minimum layout. It should be noted that k and m may be other values corresponding to different applications, such as k is equal to $2^{n-1}$−5 and m is equal to 0, which can also come to the minimum layout.

Figure 3:
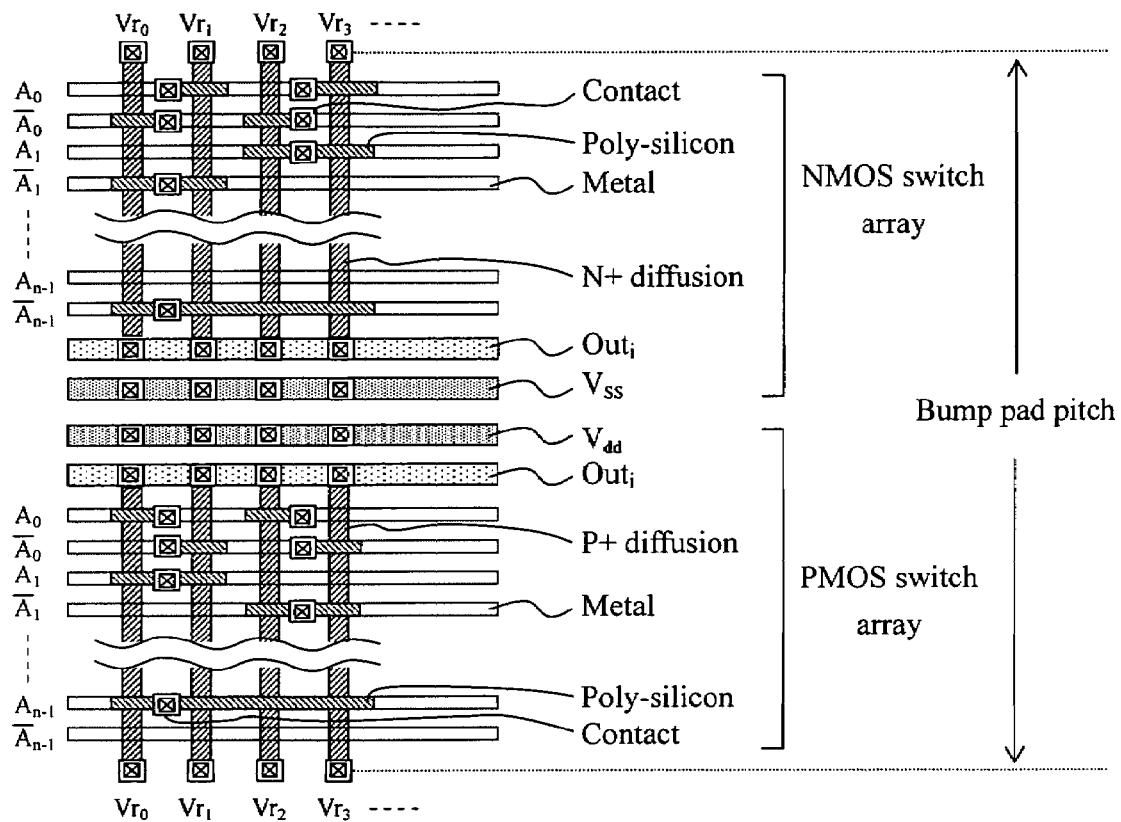
FIG. 3 is a partial layout of the NMOS and PMOS switch arrays on the same horizontal.
Figure 7:
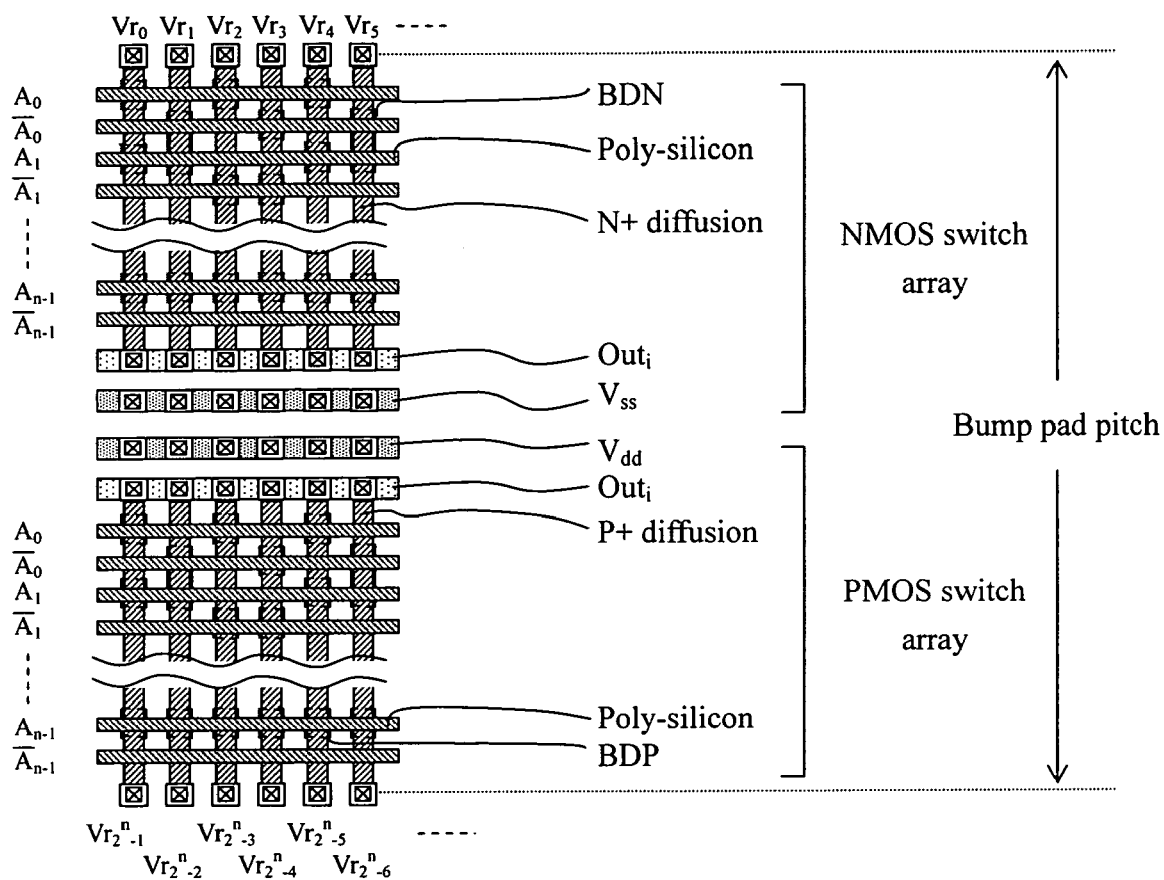
FIG. 7 is a partial layout of the NMOS and PMOS switch arrays on the same horizontal according to an embodiment of present invention.

FIG. 7 is a partial layout of the NMOS and PMOS switch arrays on the same horizontal according to an embodiment of present invention. Referring to FIG. 7, code implants, i.e. BDP and BDN, are used to connect the source and drain of the NMOS and PMOS transistors. Therefore, no contact is needed to dispose in the poly-silicon so that the bump pad pitch can be reduced. Take 0.5 um 1P2M process for example and compare to the layout as described in the related art, the bump pad pitch is reduced from 39.98 um (as shown in FIG. 3) to 33.4 um (as shown in FIG. 7).

Figure 8:
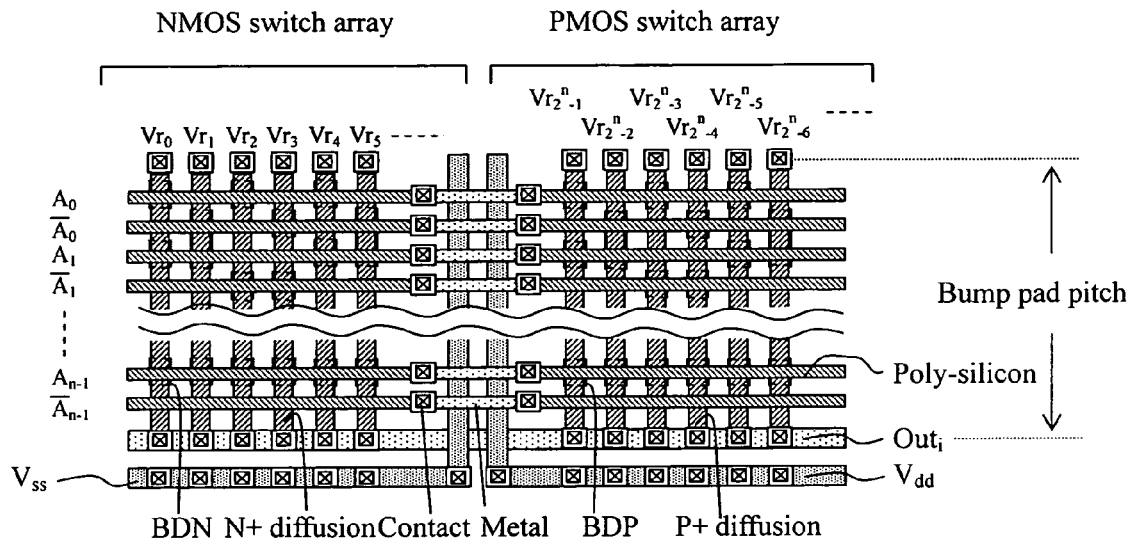
FIG. 8 is another layout of the NMOS and PMOS switch arrays according to an embodiment of present invention.

FIG. 8 is another layout of the NMOS and PMOS switch arrays according to an embodiment of present invention. Similar to the embodiment as described in FIG. 7, the present embodiment also implements BDPs and BDNs in the NMOS and PMOS transistors. The poly-silicon lines for transmitting the digital codes $A_0 \sim A_{n-1}$ and $\overline{A_0} \sim \overline{A_{n-1}}$ in the NMOS switch array and the PMOS switch array are respectively connected through corresponding metal lines across the $V_{ss}$ and $V_{dd}$ guard rings. Here, the guard rings includes two metal lines which are connected to $V_{ss}$ and $V_{dd}$ respectively and are used to avoid latchup effect between the NMOS and PMOS switch array.

Figure 9:
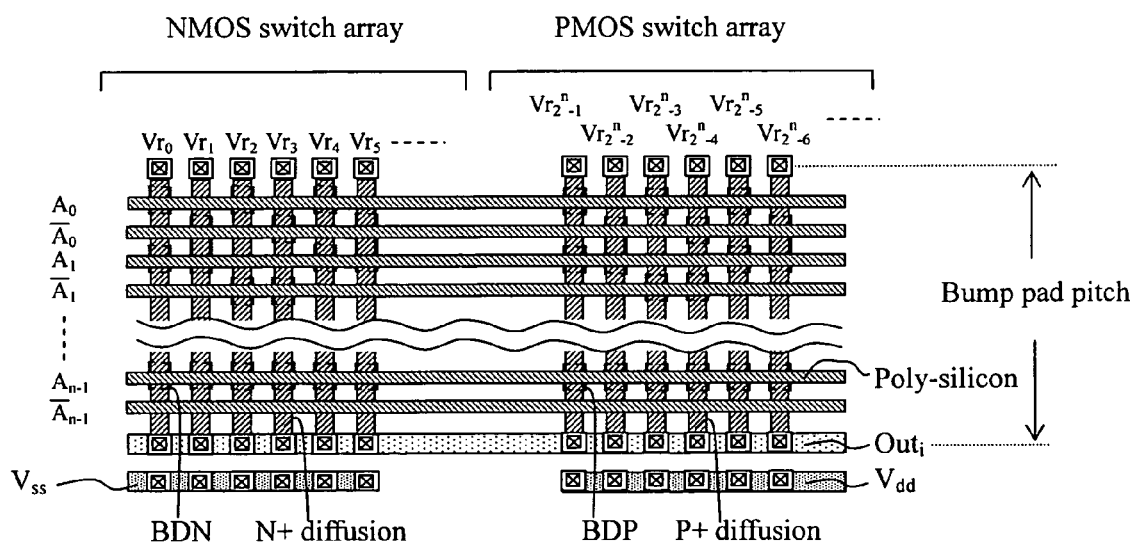
FIG. 9 is an alternative layout of FIG. 8 according to an embodiment of present invention.

FIG. 9 is an alternative layout of FIG. 8 according to an embodiment of present invention. The poly-silicon lines for transmitting the digital codes $A_0 \sim A_{n-1}$ and $\overline{A_0} \sim \overline{A_{n-1}}$ in the NMOS and the PMOS switch array are connected directly.

A distance is held between the NMOS and PMOS switch array so as to prevent from the latchup effect between the NMOS and PMOS switch array.

Figure 10:
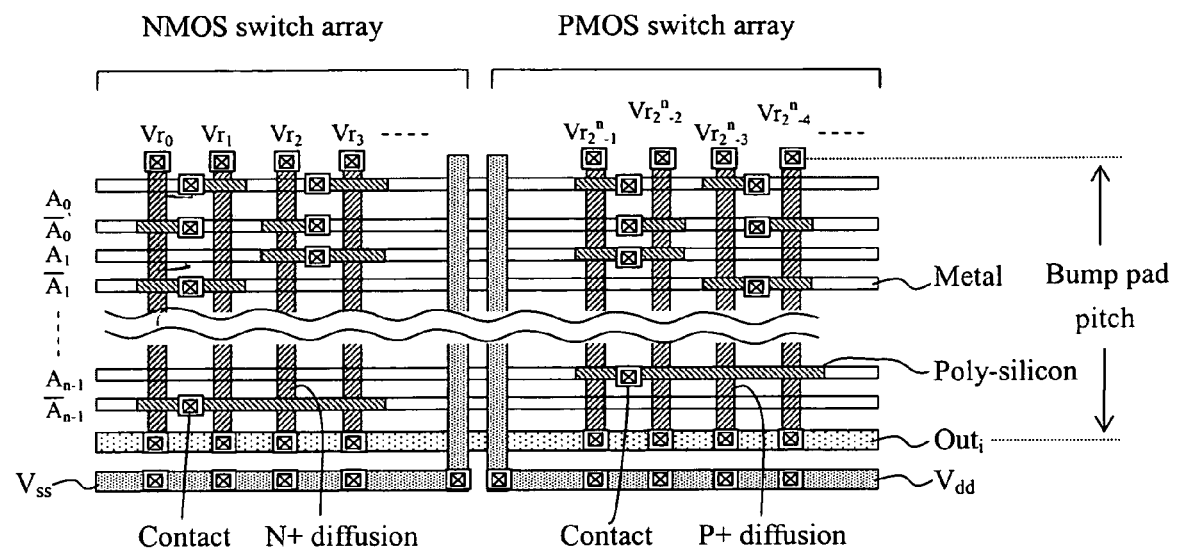
FIG. 10 is a layout of the NMOS and PMOS switch arrays according to an embodiment of present invention.

FIG. 10 is a layout of the NMOS and PMOS switch arrays according to an embodiment of present invention. Referring to FIG. 10, the decoder includes a first input stage, a second input stage, an output stage, a NMOS switch array, and a PMOS switch array. The first input stage provides multiple input voltages $Vr_0 \sim Vr_{2^n-1}$, wherein n is an integer larger than or equal to zero. The second input stage provides multiple digital code inputs $A_0, \overline{A_0}, \ldots, A_{n-1}, \overline{A_{n-1}}$ of the digital signal. The output stage is used to receive and output the voltage signal.

In addition, the NMOS switch array includes nodes of k+1 columns and 2*n rows, wherein multiple NMOS transistors are disposed in some of the nodes according to the digital signal. The NMOS switch array is suitable for receiving the input voltages $Vr_0 \sim Vr_k$ of the first input stage and the digital signal of the second input stage, and outputting one of the input voltages $Vr_0 \sim Vr_k$ to the output stage corresponding to the digital signal, wherein k is an integer larger than or equal to zero.

The PMOS switch array includes nodes of $2^n-(k-m+1)$ columns and 2*n rows, wherein multiple PMOS transistors are disposed in some of the nodes according to the digital signal. The PMOS array is suitable for receiving the input voltages $Vr_{k-m+1} \sim Vr_{2^n-1}$ of the first input stage and the digital signal of the second input stage, and outputting one of the input voltages $Vr_{k-m+1} \sim Vr_{2^n-1}$ to the output stage corresponding to the digital signal, wherein m is an integer larger than or equal to zero.

Moreover, in the NMOS switch array, the NMOS transistors in the same column are connected in series, the gates of the NMOS transistors in the same row are all coupled to one of the digital code inputs of the digital signal of the second input stage, the drains of the first NMOS transistors in each column are coupled to one of the input voltages $Vr_0 \sim Vr_k$ of the first input stage respectively, and the sources of the last NMOS transistors in each column are all coupled to the output stage.

In the PMOS switch array, the PMOS transistors in the same column are connected in series, the gates of the PMOS transistors in the same row are all coupled to one of the digital code inputs of the digital signal of the second input stage, the sources of the first PMOS transistors in each column are coupled to one of the input voltages $Vr_{k-m+1} \sim Vr_{2^n-1}$ of the first input stage respectively, and the drains of the last PMOS transistors in each column are all coupled to the output stage.

In the present embodiment, the layout concept of FIG. 8 and contact devices are adopted. The layout concept of FIG. 9 can also be applied to FIG. 10 for an alternative layout (not shown). Take 0.5 um 1P2M process for example, the bump pad pitch for the layout using BDNs and BDPs is reduced from 33.4 um (as shown in FIG. 7) to 15.86 um (as shown in FIG. 8), and the bump pad pitch for the layout using contact devices is reduced from 39.98 um (as shown in FIG. 3) to 20.54 um (as shown in FIG. 10).

With the design concept of FIG. 7, FIG. 8, and FIG. 9 in the present invention, we can get the advantages in layout: (1) bump pad pitch is scaled down, (2) corresponding DAC design matches bump pad pitch layout, (3) regular switch array is designed with code implant (BDN, BDP), (4) layout area is reduced with less metal-contact-poly structure. We can also get advantage in circuit design: (1) full swing (rail-to-rail) circuit, (2) simplified circuit. FIG. 10 can get the advantage of bump pad pitch scale down.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoder of a digital-to-analog converter for transforming a digital signal into a voltage signal, comprising:
  a first input stage for providing a plurality of input voltages $Vr_0 \sim Vr_{2^n-1}$, wherein n is an integer larger than or equal to zero;
  a second input stage for providing the digital signal;
  an output stage for outputting the voltage signal;
  a N-type Metal-Oxide-Semiconductor (NMOS)-switch array comprising a plurality of NMOS transistors of k+1 columns, suitable for receiving the input voltages $Vr_0 \sim Vr_k$ of the first input stage and the digital signal of the second input stage wherein k is an integer larger than or equal to zero; and
  a P-type Metal-Oxide-Semiconductor (PMOS) switch array comprising a plurality of PMOS transistors of $2^n-(k-m+1)$ columns, suitable for receiving the input voltages $Vr_{k-m+1} \sim Vr_{2^n-1}$ of the first input stage and the digital signal of the second input stage, wherein m is an integer larger than or equal to zero;
  wherein the NMOS switch array and the PMOS switch array output one of $Vr_0 \sim Vr_{2^n-1}$ to the output stage in accordance to the digital signal.

2. The decoder of a digital-to-analog converter as recited in claim 1, wherein the digital signal includes a plurality of digital code inputs; in the NMOS switch array, the NMOS transistors in the same column are connected in series, the gates of the NMOS transistors in the same row are respectively coupled to one of the digital code inputs of the digital signal, the drains of the NMOS transistors in a first row are coupled to one of the input voltages $Vr_0 \sim Vr_k$ respectively, and the sources of the NMOS transistors in a last row are all coupled to the output stage, moreover, a plurality of N-type buried diffusion (BDN) layers are disposed under some of the NMOS transistors.

3. The decoder of a digital-to-analog converter as recited in claim 2, wherein the BDN layers connect the source and drain of the NMOS transistors.

4. The decoder of a digital-to-analog converter as recited in claim 1, wherein the digital signal includes a plurality of digital code inputs; in the PMOS switch array, the PMOS transistors in the same column are connected in series, the gates of the PMOS transistors in the same row are respectively coupled to one of the digital code inputs of the digital signal, the sources of the PMOS transistors in a first row are coupled to one of the input voltages $Vr_{k-m+1} \sim Vr_{2^n-1}$ respectively, and the drains of the PMOS transistors in a last row are all coupled to the output stage, moreover, a plurality of P-type buried diffusion (BDP) layers are disposed under some of the PMOS transistors according to the digital signal.

5. The decoder of a digital-to-analog converter as recited in claim 4, wherein the BDP layers connect the source and drain of the PMOS.

6. The decoder of a digital-to-analog converter as recited in claim 1, wherein a predetermined space is reserved between the NMOS and PMOS switch array.

7. The decoder of a digital-to-analog converter as recited in claim 1, wherein two guard rings, coupled to the positive and the negative electrode of the power respectively, are disposed between the NMOS and PMOS switch array.

8. The decoder of a digital-to-analog converter as recited in claim 1, wherein the magnitudes of the input voltages $Vr_0 \sim Vr_k$ range from $V_{ss}$ to $V_{dd}-V_{TNB}$, wherein the $V_{ss}$ represents the negative electrode of the power, the $V_{dd}$ represents the positive electrode of the power, and the $V_{TNB}$ represents the threshold voltage of NMOS.

9. The decoder of a digital-to-analog converter as recited in claim 1, wherein the magnitudes of the input voltages $Vr_{k-m+1} \sim Vr_{2^n-1}$ range from $|V_{TPB}|$ to $V_{dd}$, wherein the $V_{dd}$ represents the positive electrode of the power, and the $V_{TPB}$ represents the threshold voltage of PMOS.

10. A decoder of a digital-to-analog converter for transforming a digital signal into a voltage signal, comprising:
a first input stage for providing a plurality of input voltages $Vr_0 \sim Vr_{2^n-1}$, wherein n is an integer larger than or equal to zero;
a second input stage for providing the digital signal;
an output stage for outputting the voltage signal;
a NMOS switch array, wherein comprising a plurality of nodes of k+1 columns, wherein a plurality of NMOS transistors are disposed in some of the nodes according to the digital signal, the NMOS switch array is suitable for receiving the input voltages $Vr_0 \sim Vr_k$ and the digital signal, wherein k is an integer larger than or equal to zero; and
a PMOS switch array, wherein comprising a plurality of nodes of $2^n-(k-m+1)$ columns, wherein a plurality of PMOS transistors are disposed in some of the nodes according to the digital signal, suitable for receiving the input voltages $Vr_{K-M+1} \sim Vr_{2^n-1}$ and the digital signal, wherein m is an integer larger than or equal to zero;
wherein the NMOS switch array and the PMOS switch array output one of $Vr_0 \sim Vr_{2^n-1}$ to the output stage in accordance to the digital signal.

11. The decoder of a digital-to-analog converter as recited in claim 10, wherein a predetermined space is reserved between the NMOS and PMOS switch array.

12. The decoder of a digital-to-analog converter as recited in claim 10, wherein two guard rings, coupled to the positive and the negative electrode of the power respectively, are disposed between the NMOS and PMOS switch array to.

13. The decoder of a digital-to-analog converter as recited in claim 10, wherein the digital signal includes a plurality of digital code inputs; in the NMOS switch array, the NMOS transistors in the same column are connected in series, the gates of the NMOS transistors in the same row are respectively coupled to one of the digital code inputs of the digital signal, the drains of the first NMOS transistors in each column are coupled to one of the input voltages $Vr_0 \sim Vr_K$ respectively, and the sources of the last NMOS transistors in each column are all coupled to the output stage.

14. The decoder of a digital-to-analog converter as recited in claim 10, wherein the digital signal includes a plurality of digital code inputs; in the PMOS switch array, the PMOS transistors in the same column are connected in series, the gates of the PMOS transistors in the same row are all coupled to one of the digital code inputs of the digital signal, the sources of the first PMOS transistors in each column are coupled to one of the input voltages $Vr_{K-M+1} \sim Vr_{2^n-1}$ respectively, and the drains of the last PMOS transistors in each column are all coupled to the output stage.

15. The decoder of a digital-to-analog converter as recited in claim 10, wherein the magnitudes of the input voltages $Vr_0 \sim Vr_K$ range from $V_{SS}$ to $V_{dd}-V_{TNB}$, wherein the $V_{SS}$ represents the negative electrode of the power, the $V_{dd}$ represents the positive electrode of the power, and the $V_{TNB}$ represents the threshold voltage of NMOS.

16. The decoder of a digital-to-analog converter as recited in claim 10, wherein the magnitudes of the input voltages $Vr_{K-M+1} \sim Vr_{2^n-1}$ range from $|V_{TPB}|$ to $V_{dd}$, wherein the $V_{dd}$ represents the positive electrode of the power, and the $V_{TPB}$ represents the threshold voltage of PMOS.

17. A digital-to-analog converter for transforming a digital signal into a voltage signal, comprising:
a first input stage for providing a plurality of input voltages $Vr_0 \sim Vr_x$, wherein x is an integer larger than or equal to zero;
a second input stage for providing the digital signal;
an output stage for outputting the voltage signal;
a first decoder, including a plurality of series-connected NMOS transistors of y columns, for receiving the input voltages $Vr_0 \sim Vr_y$, and the digital signal, wherein y is an integer larger than or equal to zero; and
a second decoder, including a plurality of series-connected PMOS transistors of z columns, for receiving the input voltages $Vr_{x-z+1} \sim Vr_x$ and the digital signal, wherein z is an integer larger than or equal to zero and x is larger or equal to y or z;
wherein the first and second decoders output one of $Vr_0 \sim Vr_x$ to the output stage in accordance to the digital signal.

18. The digital-to-analog converter as recited in claim 17, wherein a predetermined space is reserved between the first and second decoders.

19. The digital-to-analog converter as recited in claim 17, wherein two guard rings, coupled to the positive and the negative electrode of the power respectively, are disposed between the first and second decoders.

20. The digital-to-analog converter as recited in claim 17, wherein the magnitudes of the input voltages $Vr_0 \sim Vr_y$ range from $V_{SS}$ to $V_{dd}-V_{TNB}$, wherein the $V_{SS}$ represents the negative electrode of the power, the $V_{dd}$ represents the positive electrode of the power, and the $V_{TNB}$ represents the threshold voltage of NMOS.

21. The digital-to-analog converter as recited in claim 17, wherein the magnitudes of the input voltages $Vr_{x-z+1} \sim Vr_x$ range from $|V_{TPB}|$ to $V_{dd}$ wherein the $V_{dd}$ represents the positive electrode of the power, and the $V_{TPB}$ represents the threshold voltage of PMOS.

* * * * *